US 6,595,014 B2

(12) United States Patent
Malone et al.

(10) Patent No.: US 6,595,014 B2
(45) Date of Patent: *Jul. 22, 2003

(54) SPRAY COOLING SYSTEM WITH COOLING REGIME DETECTION

(75) Inventors: Christopher G. Malone, Folsom, CA (US); Cullen E. Bash, San Francisco, CA (US); Chandrakant D. Patel, Fremont, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/943,797

(22) Filed: Aug. 31, 2001

(65) Prior Publication Data

US 2002/0112491 A1 Aug. 22, 2002

Related U.S. Application Data

(60) Provisional application No. 60/271,274, filed on Feb. 22, 2001.

(51) Int. Cl.$^7$ ............................. F28D 3/00; H05K 7/20
(52) U.S. Cl. .................. 62/171; 62/259.2; 165/104.33; 361/699
(58) Field of Search ........................... 62/118, 119, 132, 62/171, 64, 259.2; 165/104.33, 908; 236/75; 239/132.5; 257/715; 361/699, 689, 698, 719, 721

(56) References Cited

U.S. PATENT DOCUMENTS

| | | | |
|---|---|---|---|
| 2,643,282 A | 6/1953 | Greene | 174/15 |
| 2,849,523 A | 8/1958 | Narbut | 174/15 |
| 2,858,355 A | 10/1958 | Narbut | 174/15 |
| 2,875,263 A | 2/1959 | Narbut | 174/15 |
| 4,141,224 A | 2/1979 | Alger et al. | 62/514 R |
| 4,290,274 A | 9/1981 | Essex | 62/157 |
| 4,352,392 A | 10/1982 | Eastman | 165/104.25 |
| 4,490,728 A | 12/1984 | Vaught et al. | 346/1.1 |
| 4,500,895 A | 2/1985 | Buck et al. | 346/140 R |
| 4,559,789 A | 12/1985 | Riek | 62/157 |
| 4,576,012 A | 3/1986 | Luzenberg | 62/157 |
| 4,683,481 A | 7/1987 | Johnson | 346/140 R |
| 4,685,308 A | 8/1987 | Welker et al. | 62/171 |

(List continued on next page.)

OTHER PUBLICATIONS

Sehmbey, M.S., Pais, M.R. and Chow, L.C., "Effect of Surface Material Properties and Surface Characteristics in Evaporative Spray Cooling," The Journal of Thermophysics & Heat Transfer, Jul.–Sep., 1992, vol. 6, No. 3, pp. 505–511.

(List continued on next page.)

Primary Examiner—Chen Wen Jiang

(57) ABSTRACT

A cooling system for cooling one or more components that produce heat. The cooling system includes sprayers configured to spray cooling fluid toward the components. A detection system includes a radiation source and a radiation sensor that pass radiant energy in the vicinity of the component such that the radiant energy is affected by passing through the vaporizing spray coolant. A controller controls the flow rates of the sprayers in response to levels of radiant energy detected by the radiation sensor, allowing the controller to more accurately control the wall temperature and cooling regime achieved by the spray cooling. The source and sensor are aimable or otherwise configured for gathering information for different thermal zones of the component, providing the controller with information that is helpful in separately controlling the wall temperature and/or cooling regime in each zone.

25 Claims, 5 Drawing Sheets

U.S. PATENT DOCUMENTS

| | | | | |
|---|---|---|---|---|
| 4,794,410 | A | | 12/1988 | Taub et al. ............. 346/140 R |
| 5,212,975 | A | | 5/1993 | Ginzburg ........................ 72/43 |
| 5,220,804 | A | | 6/1993 | Tilton et al. .................... 62/64 |
| 5,247,426 | A | | 9/1993 | Hamburgen et al. ........ 361/705 |
| 5,278,584 | A | | 1/1994 | Keefe et al. ............ 346/140 R |
| 5,434,606 | A | | 7/1995 | Hindagolla et al. ........... 347/45 |
| 5,718,117 | A | | 2/1998 | McDunn et al. ............... 62/64 |
| 5,724,824 | A | | 3/1998 | Parsons ....................... 62/171 |
| 5,797,274 | A | | 8/1998 | Jackaman et al. ............ 62/171 |
| 5,907,473 | A | | 5/1999 | Przilas et al. ............... 361/699 |
| 5,924,198 | A | | 7/1999 | Swanson et al. ........... 29/890.1 |
| 5,943,211 | A | | 8/1999 | Havey et al. ............... 361/699 |
| 5,992,159 | A | * | 11/1999 | Edwards et al. ............... 62/64 |
| 6,108,201 | A | | 8/2000 | Tilton et al. ................ 361/689 |
| 6,182,742 | B1 | | 2/2001 | Takahashi et al. ..... 165/104.33 |
| 6,205,799 | B1 | | 3/2001 | Patel et al. ................... 62/132 |

OTHER PUBLICATIONS

Pais, Martin R., Chang, Ming J., Morgan, Michael J. and Chow, Louis C., Spray Cooling of a High Power Laser Diode, SAE Aerospace Atlanta Conference & Exposition, Dayton, Ohio, 1994, pp. 1–6.

Morgan, Michael J., Chang, Won S., Pais, Martin R. and Chow, Louis C., "Comparison of High Heat–Flux Cooling Applications," SPIE, 1992, vol. 1739, pp. 17–28.

Lee, Chin C., and Chien, David H., "Thermal and Package Design of High Power Laser Diodes," IEEE, 1993, Ninth IEEE Semi–Therm Symposium, pp. 75–80.

Sehmbey, Mainder S., Chow, Louis C., Pais, Martin R. and Mahefkey, Tom, "High Heat Flux Spray Cooling of Electronics," American Institute of Physics, Jan., 1995, pp. 903–909.

Mudawar, I. and Estes, K.A., "Optimizing and Predicting CHF in Spray Cooling of a Square Surface," Journal of Heat Transfer, Aug., 1996, vol. 118, pp. 672–679.

Denney, D. Lawrence, "High Heat Flux Cooling Via a Monodisperse Controllable Spray", A Thesis Presented to The Academic Faculty of Georgia Institute of Technology in Partial Fulfillment of the Requirements for the Degree Master of Science in Mechanical Engineering, Mar. 1996.

* cited by examiner

SPRAY COOLING SYSTEM WITH COOLING REGIME DETECTION

The present application claims priority from U.S. provisional patent application, Ser. No. 60/271,274, filed Feb. 22, 2001, which is incorporated herein by reference for all purposes.

The present invention relates generally to spray-cooling systems for heat-generating devices and, more particularly, to spray-cooling regime detection in cooling methods and apparatus.

BACKGROUND OF THE INVENTION

With the advent of semiconductor devices having increasingly large component densities, the removal of heat generated by the devices has become an increasingly challenging technical issue. Many higher-dissipation semiconductor chips require substantially greater dissipation than air-cooled and liquid convection heat sinks can reasonably provide. Because liquids typically have a high latent heat of vaporization, immersion (i.e., boiling liquid off a submerged device) and spray cooling (i.e., boiling a sprayed liquid cooling fluid off a device) provide a high heat-transfer efficiency, absorbing a large quantity of heat at a constant temperature.

FIG. 1A depicts the cooling regimes that can occur during immersion, over various wall excess temperatures (i.e., the temperature difference between the chip wall temperature $T_W$ and the fluid saturation temperature $T_{Sat}$, i.e., the pressure-specific boiling point of the fluid). As depicted, an immersed chip's heat flux varies with excess temperature. When considering the performance of a cooling system with respect to an independent parameter, a local maximum dissipation level within a reasonable excess temperature range is referred to as a critical heat flux (CHF). With a good coolant, the cooling capability via immersion, with respect to heat generation, has a local maximum power density that is at reasonable temperature, the immersion CHF. When an immersed device generates heat at a rate greater than the immersion CHF, the vaporized cooling fluid forms a vapor barrier insulating the device from the liquid cooling fluid, allowing the wall temperature of the device to increase greatly from that of the immersion CHF to a level where it radiates enough energy to dissipate heat at the generated rate.

The variation in an immersed chips heat flux occurs over a number of cooling regimes, numbered 1–5 in the figure. In regimes 1 and 2, the amount of heat flux via spray cooling increases with the excess temperature. Simple convective cooling occurs in regime 1. In regime 2, nucleate boiling occurs. As discussed above, in regime 3, a vapor zone forms inside a pool of liquid, and heat dissipation reaches a maximum, the immersion CHF. The cooling regime then passes through regime 4, a transition boiling regime where additional wall temperatures result in lower heat flux, to regime 5, a film boiling regime where radiation becomes the dominant mode of heat transfer. As noted above, in regime 3, should the heat flux increase beyond CHF, the cooling would jump to regime 5, causing a large increase in the wall temperature (and likely a device failure).

When conducted at a given mass-flow rate, spray cooling can be characterized by a graph somewhat similar in shape to that of immersion cooling. A typical spray-cooling sprayer is used to spray a chip such that the cooling fluid forms a thin film on the chip that immediately vaporizes in nucleate boiling. This formation of a nucleate boiling film is similar to regime 2 (the nucleate boiling regime) for immersion cooling, but it is characterized by substantially higher dissipation levels. Nucleate boiling for spray cooling can only be accomplished at certain mass-flow rates. The spray-cooling graph varies depending on the mass-flow rate of the cooling fluid.

FIG. 1B depicts the cooling regimes that can occur during both spray cooling (at three different cooling-fluid mass-flow rates) and immersion, over varied excess temperatures. In the figure, the solid portion of the curve for each mass-flow rate represents the nucleate boiling regime. The dissipation levels for spray cooling at relatively low wall excess temperatures can reach well over an order of magnitude higher than the immersion CHF, so long as the cooling fluid is sprayed at a rate to maintain the nucleate boiling regime.

With the second mass flow rate curve (i.e., the center spray cooling curve) used as an example, with respect to heat generation, spray cooling is limited to a reasonable-temperature local-maximum power density $CHF_{m2}$, its dry-out CHF. As wall excess temperature increases, the dissipation level increases up to this maximum. If heat is generated at a rate greater than the dry-out CHF, an inadequate amount of sprayed cooling fluid is available to dissipate the heat, and the cooling regime jumps to a radiation regime (similar to regime 5 for immersion), where the wall temperature increases substantially.

Likewise looking at the second mass flow rate curve, with respect to heat generation, spray cooling is limited to a local-minimum power density at $Q_{min,2}$. Below that point, a build up of liquid can occur that will initiate immersion boiling, moving to the immersion curve with a substantially higher excess temperature. At such a low heat flux, a decrease in mass flow rate is required to revert back to a spray cooling regime, such as is depicted for moving from the immersion curve back to the first (and lowest depicted) mass flow curve.

Typically, the objective of spray cooling is to achieve a device wall temperature close to a coolant's saturation temperature, e.g., a vaporization of low boiling point fluid such as 3M FC-72 (with a boiling point of 56° C. at one atmosphere), which can achieve a chip wall temperature close to 70° C. This wall temperature is generally useful and/or necessary for keeping the device junction temperature at 85° C. This need for the chip wall temperature to remain at 70° C. stems in part from the irregular distribution of power on a chip. High power densities, reaching 200 W/cm2, for a 50 W source distributed over 0.5 cm by 0.5 cm, cannot generally be addressed by a conventional mechanical interfacing means. The temperature gradients are prohibitive with conventional interfacing, and thus spray cooling is preferable.

In a typical spray-cooling system, (see FIG. 2), an inert spray coolant from a reservoir 11 is uniformly sprayed by a group of one or more sprayers 13 onto an aligned group of one or more chips 15 mounted on a printed circuit board 17. The coolant preferably evaporates, dissipating heat within the chip. The sprayers and chips, and the board, are mounted within sealed cases 19 fixed within an electronic device such as a computer system. The vaporized sprayed coolant is typically gathered and cooled within a condenser 21, and then routed back to the reservoir by a pump 23. Any runoff or subsequently condensed fluid remaining around the circuit board is also cycled back to the reservoir.

The nozzle design is a key component of spray cooling. Sprayer designs commonly employ either pressurized liquid (i.e., pressure-assisted spraying) or pressurized gas (i.e., atomized spraying). These types of spraying can be difficult to control, which can be important in maintaining a high dissipation level, as is pointed out above. For spray-cooling systems to function at optimal efficiency, the sprayers' mass-flow rate (s) should be adjusted to avoid having the semiconductor device experience either the dry-out or pool boiling regimes (i.e., become either dry or immersed). For controllable sprayers this rate is controlled by having a controller adjust the rate that the sprayers are sprayed. Alternatively, the mass-flow rate could be adjusted to allow having the semiconductor device experience either the dry-out or pool boiling regimes, but to enforce a limit on how close to approach the dry-out and/or pool boiling CHF.

Over time, chips will generally have different activity levels, and thus have different dissipation requirements. The optimum cooling-fluid mass-flow rate changes as the heat flux of the semiconductor device changes. Thus, for a controller to correctly control the mass-flow rate, semiconductor-device and/or cooling-system parameters that indicate the cooling regime need to be sensed.

To monitor the cooling regime, temperature, pressure and/or runoff mass-flow sensors can be used. In particular, some parameters that can be used for sensing the cooling regime and/or cooling efficiency of a single, uniformly dissipating semiconductor chip include the mass-flow rate of liquid and vapor removed from a spray chamber, the vapor pressure within the spray chamber, the temperature of the semiconductor device's junction, and the temperatures of cooling fluid at various points in a cooling system. In various combinations, the information from these sensors provides indications of the chip's wall temperature, and indirectly provides indications of whether an excess wall temperature is caused by too much or too little sprayed cooling fluid.

However, many of these sensors provide information relating to an entire spray chamber. If more than one device is being sprayed within a chamber, or if a single device has different portions characterized by different dissipation rates, then such sensors will not accurately or locally discern the cooling regimes that are occurring. Furthermore, because some sensed parameters relate to byproducts of the cooling (such as runoff cooling fluid), there is typically a lag time in determining the cooling regime. Such a lag time can be significant in responding to transient conditions.

Accordingly, there has existed a need for an accurate, responsive, efficient and cost-effective apparatus and method for detecting the spray-cooling regime and/or efficiency level in which a spray-cooling system is operating. Embodiments of the present invention preferably satisfy these and/or other needs, and provide further related advantages.

SUMMARY OF THE INVENTION

In various embodiments, the present invention solves some or all of the needs mentioned above by providing a cooling system for cooling one or more components that produce heat. The cooling system includes a spray system including one or more sprayers configured to spray cooling fluid toward the components to create a reaction zone where cooling fluid vaporizes.

The cooling system features a detection system and a controller. The detection system has a radiation sensor configured to detect radiant energy from the reaction zone. The controller is configured to control the flow rate of the sprayers in response to the levels of radiant energy detected by the radiation sensor. Advantageously, the detection system provides information to the controller regarding the dissipation of heat by cooling fluid, allowing the controller to more accurately control the dissipation level and cooling regime achieved by the spray cooling.

The controller features the ability to control the mass-flow rate of the sprayers. This provides the ability to set and maintain a desired cooling regime and level of dissipation. It preferably is configured to maintain the spray cooling in the nucleate boiling regime, advantageously allowing the high CHF limit associated with nucleate boiling.

The detection system features the ability to separately detect radiant energy from a number of distinct zones of the component. This advantageously provides the controller information that is helpful in separately controlling the wall temperature and/or cooling regime in each zone.

Other features and advantages of the invention will become apparent from the following detailed description of the preferred embodiments, taken with the accompanying drawings, which illustrate, by way of example, the principles of the invention. The detailed description of particular preferred embodiments, as set out below to enable one to build and use an embodiment of the invention, are not intended to limit the enumerated claims, but rather, they are intended to serve as particular examples of the claimed invention.

DETAILED DESCRIPTION OF THE PREFERRED EMBODIMENTS

The invention summarized above and defined by the enumerated claims may be better understood by referring to the following detailed description, which should be read with the accompanying drawings. This detailed description of particular preferred embodiments of the invention, set out below to enable one to build and use particular implementations of the invention, is not intended to limit the enumerated claims, but rather it is intended to provide particular examples of them.

The present invention provides apparatus for improved spray cooling through accurate detection of the spray-cooling regime, preferably allowing accurate, localized control of the spray-cooling regime through the use of thermal inkjet-type sprayers. Through methods of the invention, spray-cooling systems are adapted to provide optimized cooling, particularly for chips with irregular power distribution. The present invention can provide superior cooling by allowing spray cooling with controllably fired individual nozzles and/or clusters of nozzles to optimize the cooling regime occurring on cooled components.

Figure 1A:
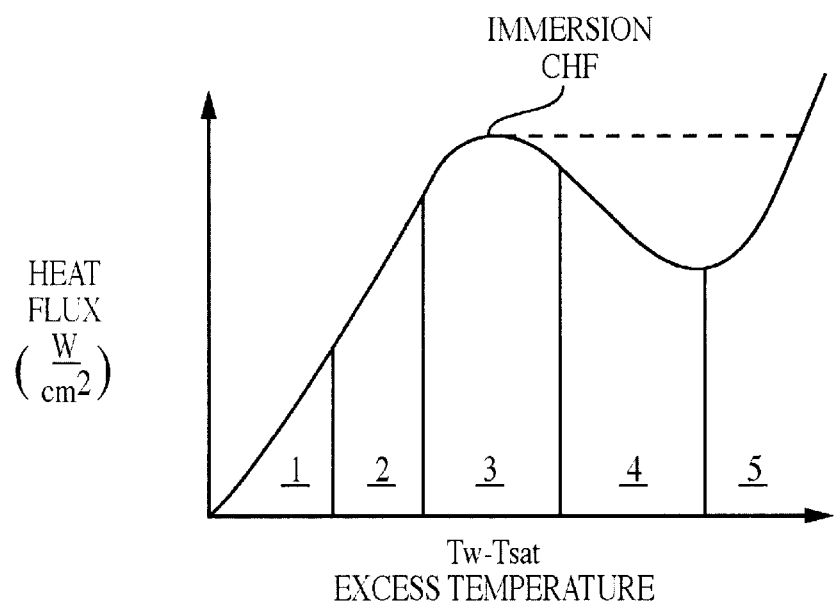
FIG. 1 is a graph describing various spray-cooling regimes.
Figure 1B:
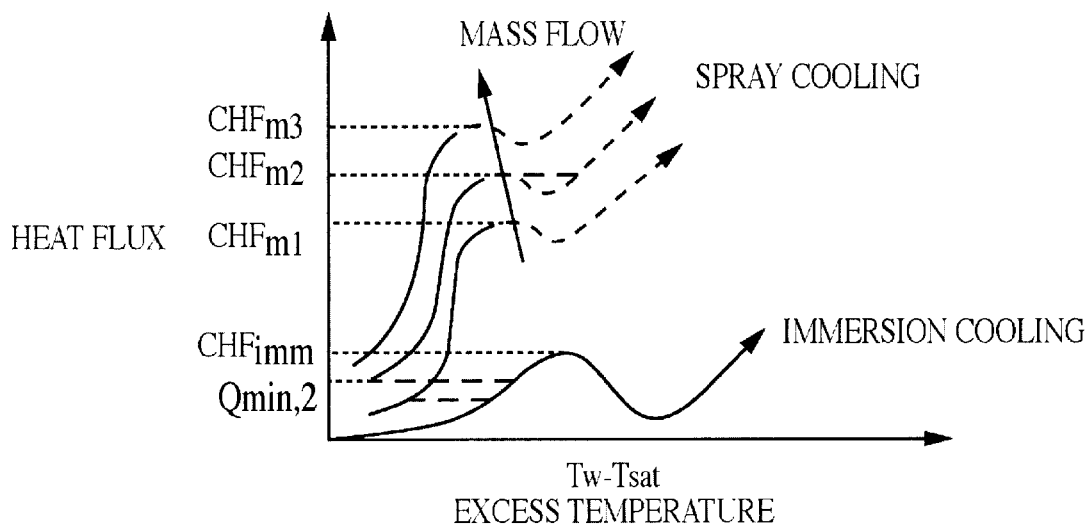
Figure 2:
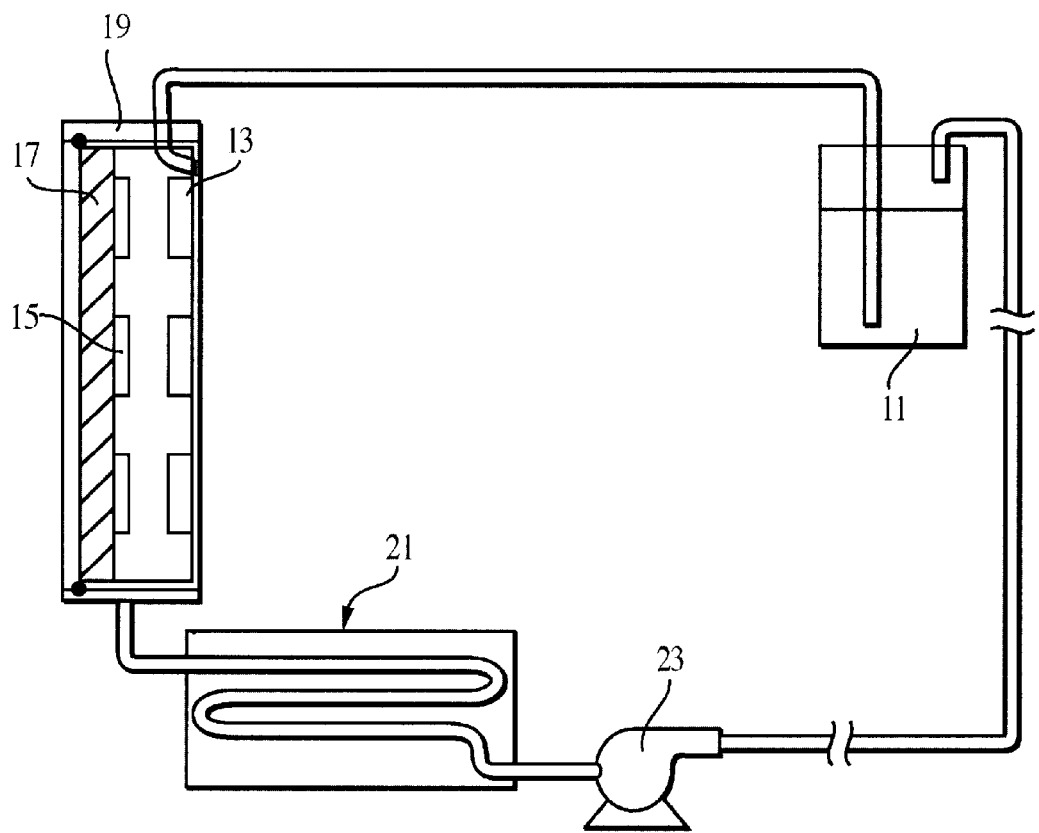
FIG. 2 is a system layout of a spray-cooling system.
Figure 3:
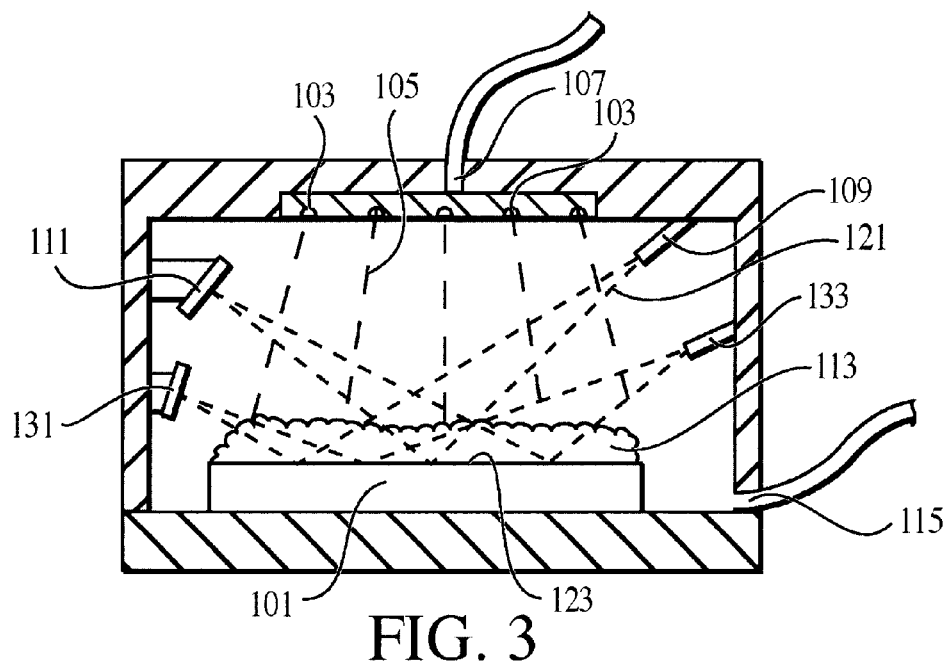
FIG. 3 is a cross-sectional view of a first spray-cooling system embodying the invention.

A first embodiment of a cooling assembly, as used in a cooling system for cooling a heat-source such as a heat-generating semiconductor device 101, is depicted in FIG. 3. The assembly includes a spray system including one or more sprayers 103 for spraying a liquid cooling fluid 105, preferably from a reservoir via an inlet 107, onto the heat source. The assembly also includes one or more radiation sources 109 and one or more radiation sensors 111.

In operation, the sprayers 103 emit a spray of liquid cooling fluid 105 targeted at the semiconductor device 101. The cooling fluid enters a reaction zone 113 immediately adjacent a surface of the semiconductor device and comes into thermal contact with the surface, where the cooling fluid becomes significantly exposed to the heat to be dissipated from the semiconductor device. The cooling fluid reacts to the heat's energy by convectively heating and/or evaporating, thereby dissipating the heat and cooling the semiconductor device.

The assembly includes an outlet 115 for evaporated and/or liquid cooling fluid, the outlet leading to a heat exchanger (not shown) to extract energy from the vaporized or heated cooling fluid, and thereby cool and/or condense it. A pump (not shown) then pumps the liquified cooling fluid back into the reservoir, completing the cycle to form a preferably closed and evacuated cooling system.

The cooling assembly of the cooling system is controlled by a preferably computerized controller, which can adjust the spray-cooled dissipation level and, preferably, the cooling regime under which the semiconductor device 101 is spray cooled. While a variety of parameters could be controlled to adjust the cooling regime, preferably the mass-flow rate (ms) of the sprayers 103 is controllable to vary the heat source's wall temperature, the dissipation level and/or the spray-cooling regime. Other possible parameters include distance between the sprayers and the chip, temperature of the cooling fluid, pressure in the spray chamber, and the like.

The cooling system preferably controls the spray cooling to provide for the continuous evaporation of cooling fluid in the nucleate boiling regime without entering the critical heat flux regime, or alternatively, only entering the beginning of the critical heat flux regime. To observe and thereby controllably maintain a desired level of dissipation in a desired cooling regime, the cooling assembly includes a detection system to detect the dissipation level and/or cooling regime in the reaction zone 113, and thus the related wall temperature of the heat source.

In particular, the detection system includes at least one of the radiation sources 109, which is configured to emit radiant energy 121 through the reaction zone 113, impinging on the cooled surface 123 of the semiconductor device 101. The radiant energy is of a type that reflects off the cooled surface, and may be in the visible spectrum. The reflected radiant energy preferably passes again through the reaction zone, and then continues to be sensed by at least one of the radiation sensors 111, which are also part of the detection system. The radiation sensor is configured to detect the reflected radiant energy emitted by the radiation source. Advantageously, at least some variations of this reflective embodiment will successfully operate on different height semiconductor devices without requiring any, or at least any significant, modifications to adjust for the height.

Preferably, the radiation source 109 and the radiation sensor 111 are placed in close proximity to the semiconductor device 101. The source directs the radiant energy onto the heat source's surface and the sensor collects the reflected radiant energy, producing a signal having an intensity proportional to the reflected radiant energy's intensity. The type of radiant energy is selected such that the reflected radiant energy will be partially obstructed, and will therefore vary in intensity, as it passes through the reaction zone 113. This intensity change will vary depending on the state of the cooling fluid in the reaction zone, and thus it will be indicative of the dissipation level and/or cooling regime occurring at the time. In particular, the intensity will vary as the cooling regime moves from the nucleate boiling regime to the critical heat flux regime or the dry-out regime in the reaction zone.

The controller can be calibrated to recognize the meaning of these differences in intensity, relative to the emitted energy, through the use of data from experimental tests where other types of dissipation and/or cooling regime detection are also employed to determine the dissipation level and/or cooling regime. When the controller is calibrated to known reactions, the detection system can thus detect the dissipation level and/or the cooling regime by noting changes in the radiation sensor's detection-signal strength. This is a relatively direct measurement of the cooling regime, as opposed to the relatively indirect measurement obtained from a cooling fluid's characteristics after leaving the reaction zone, and is not generally subject to significant lag time.

Figure 4:
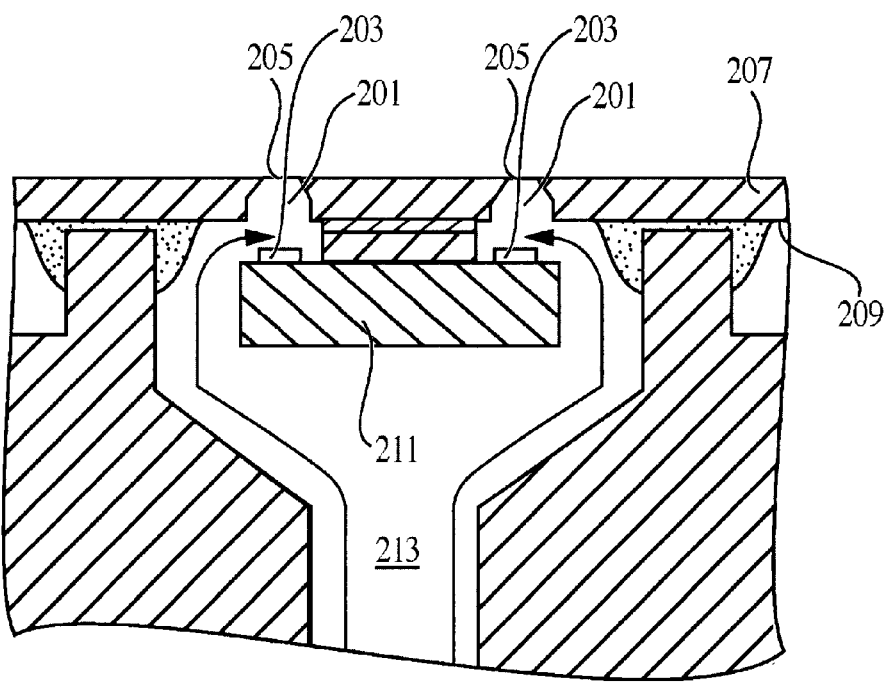
FIG. 4 is a cross-sectional view of two inkjet-type nozzles, as used in the first spray-cooling system, depicted in FIG. 3.

To responsively provide accurate control over the sprayers' mass-flow rate, the sprayers are preferably configured to be incremental sprayers that provide responsive control, and most preferably are thermal inkjet-type sprayers. With reference to FIG. 4, which depicts two simplified, exemplary incremental, thermal inkjet-type sprayers, each sprayer includes structure defining a chamber 201 for receiving a predetermined portion of cooling fluid and a heater 203 for vaporizing a portion of the cooling fluid, to create the pressure to eject an incremental amount of the cooling fluid through an orifice 205 that directs the ejected cooling fluid toward the hot component 101 (FIG. 3). The orifices are preferably formed in a flexible polymer tape 207, e.g., a polyimide tape such as is sold under the mark KAPTON®.

Affixed to a back surface 209 of the tape 207 is a silicon substrate 211 containing the heaters 203, in the form of individually energizable thin-film resistors. Each heater is preferably located on a side of the chamber 201 across from the chamber's orifice 205. Cooling fluid is preferably drawn and loaded into the chamber by capillary action, as is typical for an ink-jet type device. The computerized controller energizes the heater, vaporizing the portion of the cooling fluid adjacent to the heater. The vaporized cooling fluid expands, expelling most of the non-vaporized cooling fluid out of the orifice, typically as a single droplet.

Depending on the configuration of the sprayer, the incremental amount of the fluid sprayed from the sprayer could be in the form of a single droplet, or in the form of multiple droplets. Multiple droplets could be produced by multiple orifices related to a single heater, or by sprayers having larger chamber volumes and appropriately shaped orifice nozzles to cause the incremental amount of fluid to break into droplets. After the chamber has been fired by the heater, capillary action again loads the chamber for a subsequent firing.

The liquid spray from the incremental sprayers is highly controllable by the controller. By increasing or decreasing the frequency that the sprayers are energized, the flow rate can be accurately adjusted. Furthermore, because the sprayers can be configured to deliver very small quantities of cooling fluid, and because many sprayers can be fit into a small area, the heat distribution over that area can be very accurately controlled by individually energizing some sprayers at rates greater than that of other sprayers.

The high degree of sprayer control afforded by the incremental inkjet sprayers provides the capability to vary the dissipation level spatially across the surface of the semiconductor device. For a semiconductor device having a predictable variation of dissipation levels in different spatial zones across the reaction zone, the detection system can be targeted at a single zone on the semiconductor device, and the sprayers can be varied appropriately in the other spatial zones across the device to maintain desired level(s) of dissipation at each location.

To provide a similar level of control over the dissipation levels throughout different spatial zones for a semiconductor device that does not have a spatially predictable dissipation variation, the detection device is preferably configured to detect dissipation levels and/or cooling regimes at a plurality of locations covering a plurality of spatial zones within the reaction zone. This can be accomplished in a variety of ways.

In a first variation of the first embodiment, the radiant energy is directed broadly across the semiconductor device from a single radiation source 109, and either a large radiation sensor or one or more additional sensors 131 are configured to receive the reflected radiant energy from different locations across the different spatial zones. The radiant energy can be directed broadly by either using a broad beam, or by electronically or mechanically sweeping or pointing a directed beam over a variety of locations.

In a second variation of the embodiment, one or more additional radiation sources 133 are configured and directed to reflect radiant energy through a plurality of spatial zones, toward the radiation sensor 111. The radiation sources can be used sequentially so that the sensor can differentiate the sources between the sources of the radiant energy received, or the sensor can be mechanically or electronically (such as by filtering) focused on each arriving beam of radiant energy. Other configurations to provide information on the dissipation levels and/or cooling regimes in various spatial zones throughout the reaction zone are also envisioned within the scope of the invention. For example, FIG. 3 depicts a combination of the above two variations, having two radiation sources and two radiation sensors, thereby providing information from at least four different spatial zones.

Figure 5:
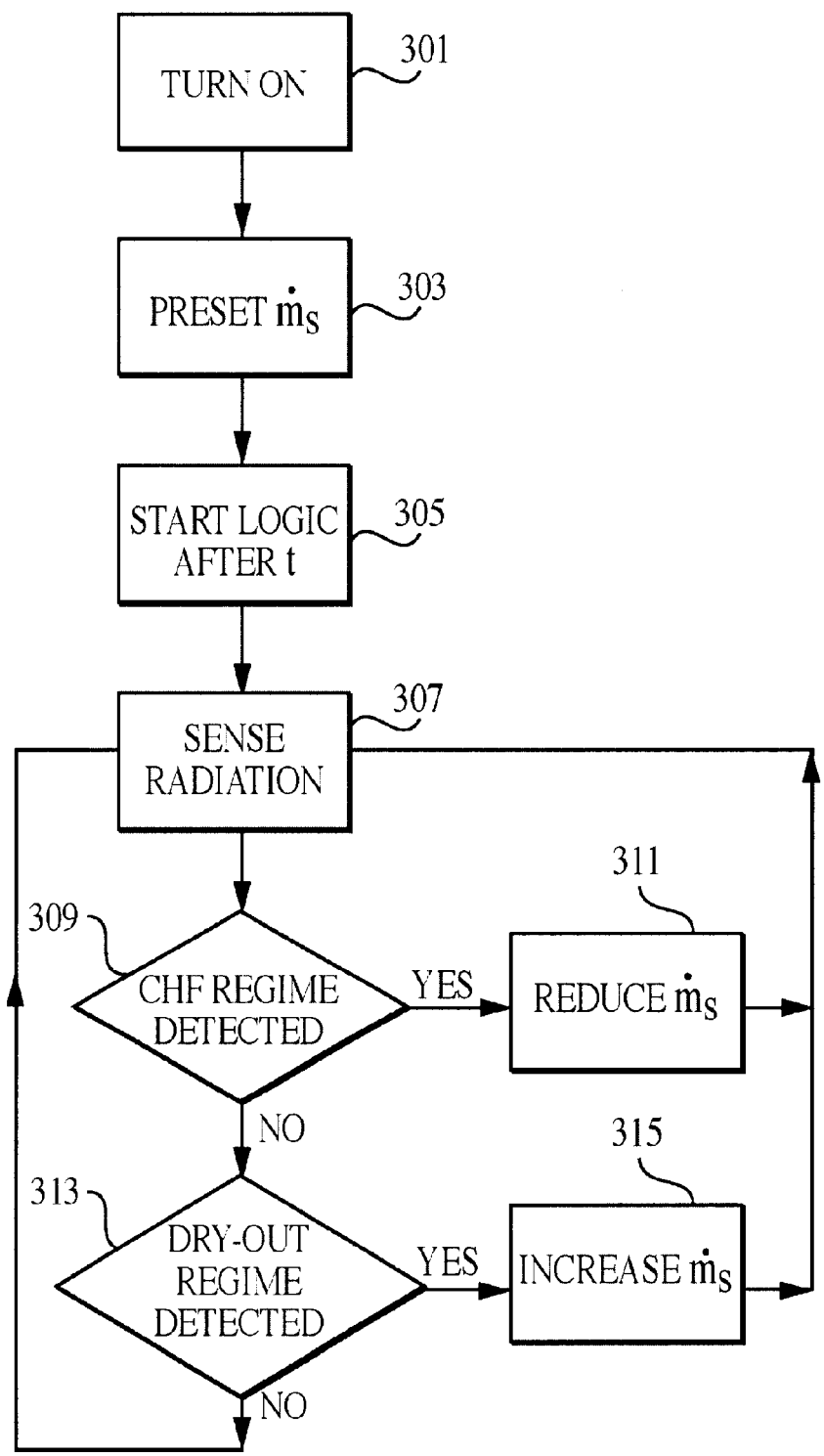
FIG. 5 is a control system block diagram for a controller for controlling the operation of sprayers in the first spray-cooling system, depicted in FIG. 3.

With reference to FIGS. 3 and 5, a method of cooling the heat source 101 by adjusting the sprayers' mass-flow rate(s) begins with the steps of starting 301 the cooling system and setting 303 the sprayers' initial mass-flow rate at an initial value ($m_{S,init}$). This value typically would be based on prior experience with this system, or with systems of its type, but could also be based on calculated heat generations rates and cooling rates. The controller preferably allows 305 a limited amount of time (t) to pass so that the system can begin functioning, and then the sensing logic begins to take action, i.e., the detection system begins sensing and monitoring parameters and adjusting the sprayers' mass-flow rates.

The radiation source 109 emits an optical beam at the semiconductor device 101, which passes through the reaction zone 113 and reflects off the semiconductor device, again passing through the reaction zone. The reaction occurring in the reaction zone obstructs the optical beam to some degree, which varies depending on the cooling regime occurring at the time. The radiation sensor then senses 307 the reflected and partially obstructed light beam, and measures its intensity. The radiation sensor passes the intensity information to the controller, which compares it to known and/or past values to establish the cooling regime that is occurring in the reaction zone.

If the controller determines 309 that the sprayed coolant is experiencing pool boiling (i.e., it is approaching the pool boiling CHF), the controller reduces 311 the mass-flow rate $m_s$ of the sprayers. If the controller determines 313 that dry-out is occurring (i.e., it is approaching the dry-out CHF), the controller increases 315 the mass-flow rate $m_s$ of the sprayers. The cycle of sensing, determining and adjusting (increasing or decreasing) the mass-flow rate repeats while the system is in operation. Optionally, the sensors can be calibrated tightly enough not only to detect the transition into a regime containing a CHF, but also to detect how close the boiling is to CHF. This allows even higher dissipation levels to be reached.

Optionally, other sensors could be used to enhance the system. For example, a temperature sensor could be used to detect the wall temperature at one or more spatial zone locations of the heat source. In this variation, the temperature measurements could be monitored, and radiant energy level determinations would only need to be conducted when the temperature passed over a selected maximum level. This variation would simplify radiant energy detection, as it would only need to detect the difference between pooling and dry-out, because the temperature would presumably be below the selected maximum temperature while nucleate boiling was occurring.

The second and third embodiments of the invention provide an alternative to the reflective detection system (i.e., one using reflected radiant energy) of the first embodiment. In particular, the second and third embodiments have detection systems configured for non-reflected transmittance and emission, respectively.

Figure 6:
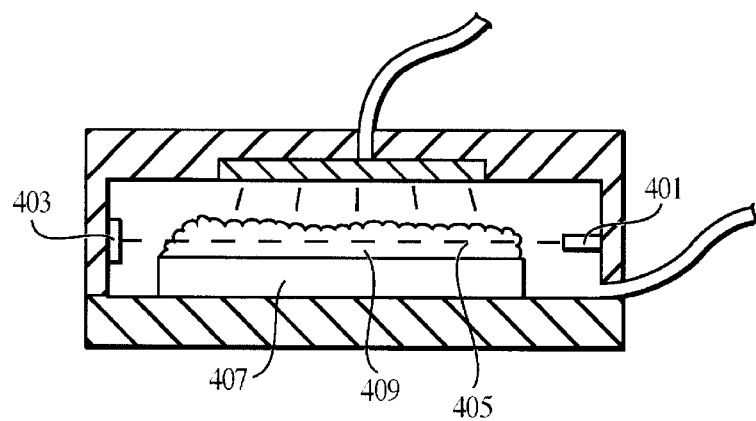
FIG. 6 is a cross-sectional view of a second spray-cooling system embodying the invention.

With reference to FIG. 6, for the detection system of the second embodiment to measure transmittance, one or more radiation sources 401 and one or more radiation sensors 403 are positioned to emit and sense radiant energy 405, respectively, across (i.e., just next to, and generally parallel to) the surface of a semiconductor device 407, thereby passing through a reaction zone 409. The pool boiling and dry-out regimes are detected via sensing the intensity level of the received signal relative to the transmitted signal. The radiation source(s) and sensor(s) can be arrayed to supply spatial information. Likewise, the beam size and/or detection angles can be broadly directed or swept to provide additional information. Other features of the first embodiment are preferably included in this embodiment where applicable.

Because the detection system of the second embodiment does not have to be positioned to "look down" on the surface of the semiconductor device, it might be possible for variations of the second embodiment to be smaller than variations of the first embodiment for an equivalent cooling device. Advantageously, in this detection system, the radiant energy typically passes through significantly more of the reaction zone, thus potentially providing for more precise measurements of uniform reactions. However, to measure differences between different spatial zones that the radiant energy passes through on the heat source, the controller will need to compare different signals passing through different combinations of spatial zones.

Figure 7:
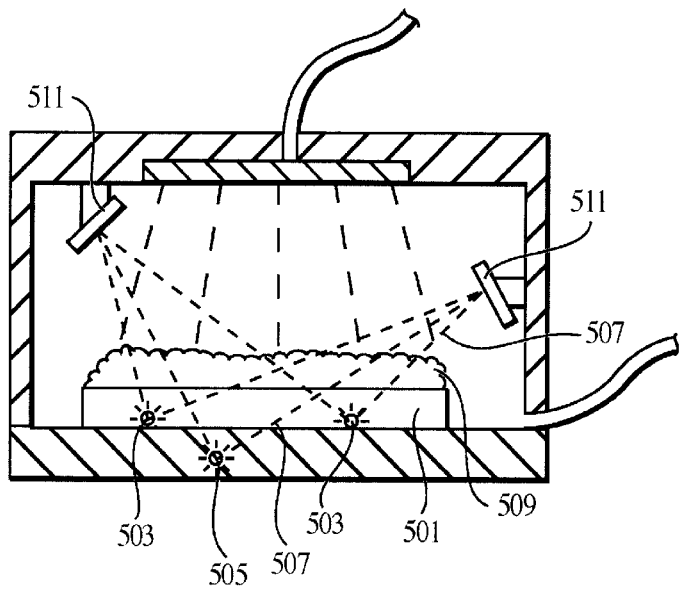
FIG. 7 is a cross-sectional view of a third spray-cooling system embodying the invention.

With reference to FIG. 7, the detection system of the third embodiment measures radiant energy emitted by, from within, or from behind a heat source, such as a semiconductor device 501. In particular, the heat source can include one or more internal radiation sources 503, or one or more external radiation sources 505 are positioned behind the heat source, emitting a form of radiant energy 507 that can pass through the heat source and its related reaction zone 509. The radiant energy 507 can be measured by one or more radiation sensors 511 positioned appropriately near the semiconductor device to detect the radiant energy after it passes through the reaction zone. Alternatively, the radiation sensors can measure radiant heat emitted by the device. Optionally, this information could be augmented by temperature sensors on or within the device.

As with the other embodiments, pool boiling and dry-out conditions can be detected by changes in the measured signal due to its obstruction in the reaction zone 509. One or more of the radiation sensors 511 can be configured to separately receive radiant energy from one or more internal radiation sources 503, or external radiation sources 505, thus providing spatial information (i.e., information on different spatial zones within the reaction zone 509). This system potentially provides simplicity, and relative ease and low cost for manufacture. Other features of the first embodiment are preferably included in this embodiment where applicable.

Alternatively, a detection system can be developed that combines two or more of the above-described embodiments. For example, in a combination of the first two embodiments, the reflected signals may provide spatial information, while the non-reflected transmittance system provides accurate detection levels.

Figure 8:
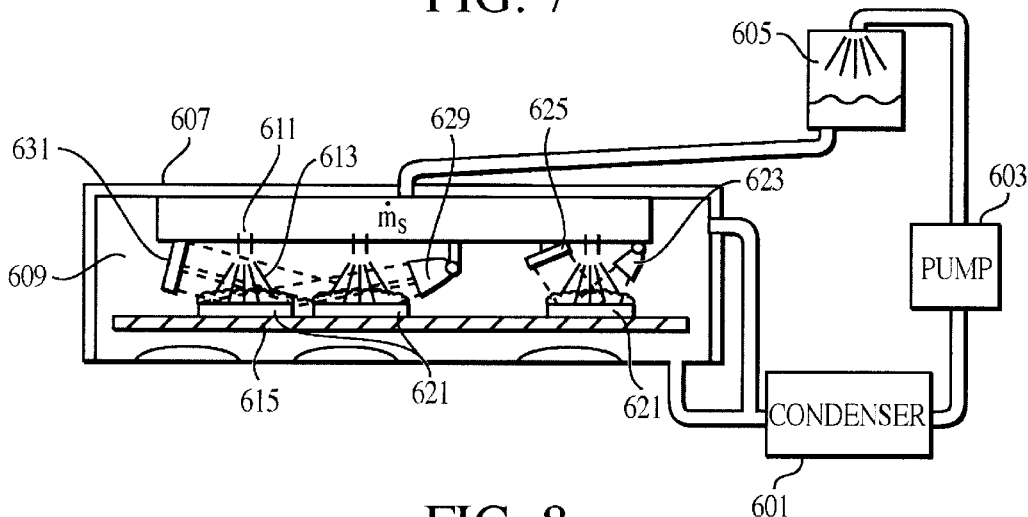
FIG. 8 is a system layout of a fourth spray-cooling system embodying the invention.

Advantageously, the configurations of the above-described embodiments can be applied to cooling systems that contain more than one heat-producing semiconductor chips inside a single spray-cooling chamber. With reference to FIG. 8, a spray-cooling assembly is configured with a condenser 601, a pump 603, a reservoir 605 and a housing 607 defining a spray-cooling chamber 609. Within the chamber, sprayers 611 are configured to spray cooling fluid 613 on a plurality of semiconductor chips mounted on at least one circuit board or other substrate 615. The cooing system includes a detection system configured to detect a plurality of cooling regimes from one or more spatial zones over each of the semiconductor devices, or alternatively, over a number of separate groups of semiconductor devices.

In particular, one or more chips 621, each have individual detection systems including one or more radiation sources 623 and one or more radiation sensors 625 dedicated to detecting the dissipation levels and/or cooling regimes in one or more spatial zones of their respective component. Additionally (or alternatively), there are one or more groups of two or more chips 627, each group sharing a shared detection system comprised of one ore more radiation sources 629 and one ore more radiation sensors 631 dedicated to detecting the dissipation levels and/or cooling regimes across one or more spatial zones on each component of their respective group. The radiation sources 629 and sensors 631 are preferably configured to detect pooling and/or dry-out from a plurality of locations, by having more than one radiation sources 629 and sensors 631 or by having the ability to sweep their emission and/or detection angles.

Under various embodiments of the present invention, a detection technique, preferably based on the reflectance, emission, or transmittance of radiant energy, or on a combination of these detection techniques within a single detection system, enables non-contact cooling regime sensing for temporal and spatial control of the coolant suppled to a heat source (which can be a dissipater thermally connected to a component), which is typically a semiconductor device. Spatial and/or temporal surface monitoring is preferably used for the detection of critical heat flux and dry-out to provide feedback control for cooling, preferably by controlling the coolant supply rate.

Because the sensors are more directly sensing the status of the cooling reaction than occurs in many other techniques, it is believed that the system response exceeds that attained using pressure, temperature and/or mass flux measurements. Thus, the cooling system will better keep the device from overheating by optimizing cooling fluid flow under varying conditions.

Embodiments of the invention can incorporate various combinations of the spray-cooling apparatus described in U.S. Pat. No. 6,205,799, which is incorporated herein by reference for all purposes. For example, the cooling system can incorporate the various sensors described in the patent to provide additional information for the control system.

While the highly controllable thermal ink-jet-type sprayers are preferable, the invention can alternatively use sprayers based on other types of spray technology. For example, other incremental, ink-jet droplet-expelling technology, such as piezoelectric technology (i.e., piezoelectric nozzles) could be used within the scope of the invention. Examples of this technology are discussed in numerous U.S. Pat. Nos. including Nos. 5,924,198, 4,500,895, and 4,683,481, which are incorporated herein by reference. Other thermal ink-jet technologies can likewise be appropriate for use for spray cooling. Also, pressure-assisted spraying, atomized spraying, or other forms of spraying, to the extent that they can be made controllable, would also be appropriate. Likewise, as noted above, the invention can use other means for controlling the cooling regime.

Multiple cooling assemblies within one computer (or other electronic system) can be configured to share components. For example, a computer can contain a cooling system including a plurality of devices, each being an embodiment from the above-described cooling assembly. These cooling assemblies can be combined to share a single condenser, pump and/or reservoir.

It is to be understood that the invention comprises apparatus and methods for designing cooling systems and for producing cooling systems, as well as the apparatus and methods of the cooling system itself. Additionally, the various embodiments of the invention can incorporate various combinations of the features disclosed above in generally discussing an inkjet spray-cooling system, and can be designed, made and operated using related methods (or portions thereof) as described above for the inkjet spray-cooling system. In short, the above disclosed features can be combined in a wide variety of configurations within the anticipated scope of the invention.

While particular forms of the invention have been illustrated and described, it will be apparent that various modifications can be made without departing from the spirit and scope of the invention. Thus, although the invention has been described in detail with reference only to the preferred embodiments, the invention is not intended to be limited by the above discussion, and is defined with reference to the following claims.

We claim:

1. A cooling system for cooling at least one semiconductor component, comprising:

a spray system including one or more sprayers configured to spray cooling fluid toward the at least one semiconductor component to create a reaction zone where the cooling fluid vaporizes;

a detection system including a radiation sensor configured detect radiant energy from the reaction zone; and a controller configured to control a temperature of the at least one semiconductor component in response to levels of radiant energy detected by the radiation sensor.

2. The cooling system of claim 1, wherein the controller is configured to control the temperature of the at least one semiconductor component by controlling the mass-flow rates of the one or more sprayers.

3. The cooling system of claim 2, and further comprising a radiation source configured to emit radiant energy through the reaction zone for detection by the radiation sensor.

4. The cooling system of claim 2, wherein the radiation sensor is configured to detect the transmittance of radiant energy passing directly across the reaction zone without reflection.

5. The cooling system of claim 2, wherein the radiation sensor is configured to detect radiant energy reflected off the at least one semiconductor component and passing through the reaction zone.

6. The cooling system of claim 2, wherein the radiation sensor is configured to detect radiant energy emitted by the at least one semiconductor component and passing through the reaction zone.

7. The cooling system of claim 2, wherein the controller is configured to control the flow rate of the sprayers such that the spray cooling occurs primarily in the nucleate boiling regime.

8. The cooling system of claim 2, wherein the radiation sensor is configured to detect radiant energy from a plurality of directions.

9. The cooling system of claim 2, wherein the detection system is configured to separately detect radiant energy from a plurality of spatial zones in the reaction zone.

10. The cooling system of claim 9, wherein the spray system of one or more sprayers includes a zone-specific sprayer for each of the plurality of spatial zones, each zone-specific sprayer being targeted to spray cooling fluid toward its respective spatial zone.

11. The cooling system of claim 10, wherein the at least one semiconductor component consists of one semiconductor component.

12. The cooling system of claim 10, wherein the at least one semiconductor component comprises a plurality of semiconductor components, and wherein each spatial zone is limited to one semiconductor component of the plurality of semiconductor components.

13. A method for cooling a semiconductor component, comprising:

spraying cooling fluid toward the semiconductor component to create a reaction zone where cooling fluid vaporizes;

detecting radiant energy from the reaction zone; and controlling the temperature of the semiconductor component in response to the level of radiant energy detected in the step of detecting.

14. The method of claim 13, wherein the step of controlling the temperature of the semiconductor component comprises controlling the mass-flow rates that the cooling fluid is sprayed in the step of spraying.

15. The method of claim 14, and further comprising emitting radiant energy through the reaction zone for detection in the step of detecting radiant energy.

16. The method of claim 14, wherein the step of detecting comprises detecting the transmittance of radiant energy passing directly across the reaction zone without reflection.

17. The method of claim 14, wherein the step of detecting comprises detecting radiant energy reflected off the semiconductor component and passing through the reaction zone.

18. The method of claim 14, wherein the step of detecting comprises detecting radiant energy emitted by the semiconductor component and passing through the reaction zone.

19. The method of claim 14, wherein in the step of controlling the temperature of the semiconductor component, the temperature is controlled such that the spray cooling occurs primarily in the nucleate boiling regime.

20. The method of claim 14, wherein the step of detecting comprises detecting radiant energy from a plurality of directions.

21. The method of claim 14, wherein the step of detecting comprises separately detecting radiant energy from a plurality of spatial zones in the reaction zone.

22. The method of claim 21, wherein the step of controlling comprises separately controlling the mass-flow rate of cooling fluid toward each spatial zone.

23. A spray-cooling system for cooling a semiconductor component, comprising:

means for spraying cooling fluid toward the semiconductor component to create a reaction zone where cooling fluid vaporizes;

means for detecting radiant energy from the reaction zone; and means for controlling a temperature of the semiconductor component in response to the level of radiant energy detected in the step of detecting.

24. The cooling system of claim 23, wherein the means for controlling is configured to control the temperature of the semiconductor component by controlling mass-flow rates of the means for spraying.

25. The cooling system of claim 24, and further comprising a radiation source configured to emit radiant energy through the reaction zone for detection by the means for detecting.

* * * * *